(12) United States Patent
Chua et al.

(10) Patent No.: US 6,967,981 B2
(45) Date of Patent: Nov. 22, 2005

(54) NITRIDE BASED SEMICONDUCTOR STRUCTURES WITH HIGHLY REFLECTIVE MIRRORS

(75) Inventors: Christopher L. Chua, San Jose, CA (US); Michael A. Kneissl, Mountain View, CA (US); David P. Bour, Cupertino, CA (US)

(73) Assignee: Xerox Corporation, Stamford, CT (US)

( * ) Notice: Subject to any disclaimer, the term of this patent is extended or adjusted under 35 U.S.C. 154(b) by 22 days.

(21) Appl. No.: 10/159,930

(22) Filed: May 30, 2002

(65) Prior Publication Data

US 2003/0231683 A1  Dec. 18, 2003

(51) Int. Cl.⁷ ................................................ H01S 5/00
(52) U.S. Cl. ......................................... 372/46; 372/45
(58) Field of Search .............................. 372/43, 45, 46, 372/87, 50

(56) References Cited

U.S. PATENT DOCUMENTS

| | | | | |
|---|---|---|---|---|
| 5,425,042 A | * | 6/1995 | Nido et al. | 372/45 |
| 5,729,566 A | * | 3/1998 | Jewell | 372/96 |
| 5,764,675 A | * | 6/1998 | Juhala | 372/50 |
| 5,812,576 A | * | 9/1998 | Bour | 372/45 |
| 5,838,707 A | * | 11/1998 | Ramdani et al. | 372/45 |
| 5,877,519 A | | 3/1999 | Jewell | |
| 5,978,401 A | | 11/1999 | Morgan | 372/50 |
| 6,148,016 A | | 11/2000 | Hegblom et al. | 372/50 |
| 6,163,557 A | * | 12/2000 | Dunnrowicz et al. | 372/46 |
| 6,252,894 B1 | * | 6/2001 | Sasanuma et al. | 372/45 |
| 6,320,206 B1 | | 11/2001 | Coman et al. | |
| 6,365,429 B1 | | 4/2002 | Kneissl et al. | |
| 6,393,038 B1 | * | 5/2002 | Raymond et al. | 372/22 |
| 6,408,015 B1 | * | 6/2002 | Kaneko | 372/50 |
| 6,448,102 B1 | | 9/2002 | Kneissl et al. | |
| 6,455,340 B1 | | 9/2002 | Chua et al. | |
| 6,483,127 B2 | * | 11/2002 | Saeki | 257/96 |
| 6,639,927 B2 | * | 10/2003 | Sato et al. | 372/46 |
| 6,711,192 B1 | * | 3/2004 | Chikuma et al. | 372/43 |
| 6,744,800 B1 | | 6/2004 | Kneissl et al. | |
| 6,757,314 B2 | | 6/2004 | Kneissl et al. | |

FOREIGN PATENT DOCUMENTS

| | | |
|---|---|---|
| EP | 0 896 405 A2 | 2/1999 |
| GB | 2 346 478 A | 8/2000 |

OTHER PUBLICATIONS

Communication from European Patent Office re Application No. 02258579.8-1235, dated Nov. 4, 2004, including European Search Report and Annex to the European Search Report.

Mathine, D.L., Nejad, H., Allee, D.R., Droopad, R., Maracas, G.N., "Reduction of the Thermal Impedance of Vertical-Cavity Surface-Emitting Lasers After Integration with Copper Substrates", Applied Physics Letters, vol. 69, No. 4, Jul. 22, 1996, pp. 463-464.

* cited by examiner

Primary Examiner—David Porta
Assistant Examiner—Davienne Monbleau

(57) ABSTRACT

A nitride based resonant cavity semiconductor structure has highly reflective mirrors on opposite sides of the active layer. These highly reflective mirrors can be distributed Bragg reflectors or metal terminated layer stacks of dielectric materials. The nitride based resonant cavity semiconductor structure can be vertical cavity surface emitting laser (VCSEL), a light emitting diode (LED), or a photodetector (PD), or a combination of these devices.

39 Claims, 6 Drawing Sheets

NITRIDE BASED SEMICONDUCTOR STRUCTURES WITH HIGHLY REFLECTIVE MIRRORS

CROSS-REFERENCE TO RELATED APPLICATIONS

This application contains subject matter that is related to subject matter of U.S. patent application Ser. No. 10/024,236 by Chua et al. entitled "METHOD OF FABRICATING GaN SEMICONDUCTOR STRUCTURES USING LASER-ASSISTED EPITAXIAL LIFTOFF", filed Dec. 21, 2001 and now issued as U.S. Pat. No. 6,455,340, commonly assigned to the same assignee herein and herein incorporated by reference.

BACKGROUND OF THE INVENTION

The present invention relates generally to nitride based semiconductor structures, and more particularly to a nitride based resonant cavity semiconductor structure with highly reflective mirrors on both sides of the semiconductor structure. The highly reflective mirrors are typically distributed Bragg reflectors (DBR), but can also be simpler metal terminated layer stacks of dielectric materials.

A planar multi-layered semiconductor structure can have one or more active semiconductor layers bounded at opposite sides with layers that form distributed Bragg reflectors. The distributed Bragg reflectors at opposite sides of the active semiconductor layer are formed from alternating high refractive index and low refractive index quarter-wavelength thick semiconductor or dielectric layers that function as mirrors. The multiple layers between the opposing distributed Bragg reflectors, including the active semiconductor layer, form a resonant cavity for light emission or light absorption within the semiconductor structure. The active semiconductor layers within the resonant cavity will either emit light for a light emitting diode (LED) or vertical cavity surface emitting laser (VCSEL) or absorb light for a photodetector (PD).

The semiconductor layers on one side of the active layer in the structure are doped with impurities so as to have an excess of mobile electrons. These layers with excess electrons are said to be n-type, i.e. negative. The semiconductor layers on the other side of the active layer in the structure are doped with impurities so as to have a deficiency of mobile electrons, therefore creating an excess of positively charged carriers called holes. These layers with excess holes are said to be p-type, i.e. positive.

A forward biased electrical potential is applied through electrodes between the p-side and the n-side of the layered structure, thereby driving either holes or electrons or both in a direction perpendicular to the planar layers across the p-n junction so as to "inject" them into the active layers, where electrons recombine with holes to produce light.

A light emitting diode (LED) will emit light from the resonant cavity through one of the mirrors through either the upper or lower surface of the semiconductor structure. The mirror reflectivities are typically made lower than lasers to allow efficient light emission.

For a laser (VCSEL), optical feedback provided by the opposing mirrors allows resonance of some of the emitted light within the resonant cavity to produce amplified stimulated emission of coherent "lasing" through one of the mirrors through either the upper or lower surface of the semiconductor structure.

For a photodetector (PD), a reverse biased electrical potential is applied through the electrodes between the p-side and the n-side of the layered structure. A photodetector will absorb light in the active layer of the resonant cavity, thereby generating electron/hole pairs at the active layer. The generated carriers are collected at the device electrode at either the upper or lower surface of the semiconductor structure forming a photocurrent signal.

Nitride based semiconductors, also known as group III nitride semiconductors or Group III–V semiconductors, comprise elements selected from group III, such as Al, Ga and In, and the group V element N of the periodic table. The nitride based semiconductors can be binary compounds such as gallium nitride (GaN), as well as ternary alloys of aluminum gallium nitride (AlGaN) or indium aluminum nitride (InGaN), and quarternary alloys such as aluminum gallium indium nitride (AlGaInN). These materials are deposited on substrates to produce layered semiconductor structures usable as light emitters or light detectors for optoelectronic device applications. Nitride based semiconductors have the wide bandgap necessary for short-wavelength visible light emission in the green to blue to violet to the ultraviolet spectrum.

These materials are particularly suited for use in short-wavelength VCSELs or LEDs or PDs for several important reasons. Specifically, the InGaAlN system has a large bandgap covering the entire visible spectrum. III–V nitrides also provide the important advantage of having a strong chemical bond which makes these materials highly stable and resistant to degradation under the high electric current and the intense light illumination conditions that are present at active regions of the devices. These materials are also resistant to dislocation formation once grown.

Semiconductor resonant cavity structures comprising nitride semiconductor layers grown on a sapphire substrate will emit or absorb light in the near ultra-violet to visible spectrum within a range including 280 nm to 650 nm, allowing better efficiency and narrower line widths for LEDs and photodetectors.

The shorter wavelength blue of nitride based semiconductor VCSELs and LEDs provides a smaller spot size and a better depth of focus than the longer wavelength of red and infrared (IR) VCSELs and LEDs for high-resolution or high-speed laser printing operations and high density optical storage. In addition, blue light emitting devices can potentially be combined with existing red and green lasers or LEDs to create projection displays and color film printers.

In many applications, the conventional substrate material for semiconductor structures would be silicon or gallium arsenide. However, the GaN crystal structure, combined with the high GaN growth temperatures, make deposition of high-quality nitride semiconductor material directly onto semiconductor substrates such as Si or GaAs very difficult. Nitride based semiconductor structures currently require heteroepitaxial growth of GaN thin layers onto dissimilar substrates such as sapphire or silicon carbide.

A problem specific to fabricating GaN VCSELs and resonant cavity LED's and photodetectors is the difficulty in growing the highly reflective AlGaN-based distributed Bragg reflectors (DBRs) needed for stimulated emission of coherent light of VCSELs or the emission or collection of light for resonant cavity LED's and PD's, where the minimum aluminum content for the AlGaN layers in the DBRs is limited by self absorption of the light and the maximum aluminum content is limited by lattice matching constraints.

Similar problems plague the long wavelength indium phosphide VCSELs but the problem in phosphide based laser structures can be solved by etching a hole through the substrate and evaporating dielectric materials to form the DBR. Unfortunately, the usual substrate for nitride based structures, i.e. sapphire, is difficult to dry or wet etch, so that this back-etch procedure is not available to the fabrication of the nitride based resonant cavity structure.

It is an object of the present invention to provide highly reflective mirrors on both sides of the nitride based resonant cavity semiconductor structure.

SUMMARY OF THE INVENTION

According to the present invention, a nitride based resonant cavity semiconductor structure has highly reflective mirrors on opposite sides of the active layer. These highly reflective mirrors can be distributed Bragg reflectors or metal terminated layer stacks of dielectric materials.

The nitride based resonant cavity semiconductor structure can be vertical cavity surface emitting laser (VCSEL), a light emitting diode (LED), or a photodetector (PD), or a combination of these devices.

Other objects and attainments together with a fuller understanding of the invention will become apparent and appreciated by referring to the following description and claims taken in conjunction with the accompanying drawings.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

DETAILED DESCRIPTION

In the following detailed description, numeric ranges are provided for various aspects of the embodiments described. These recited ranges are to be treated as examples only, and are not intended to limit the scope of the claims hereof. In addition, a number of materials are identified as suitable for various facets of the embodiments. These recited materials are to be treated as exemplary, and are not intended to limit the scope of the claims hereof. In addition, the figures are not drawn to scale for ease of understanding the present invention.

Reference is now made to the Figures, wherein there is illustrated a nitride based resonant cavity semiconductor structure 10 with mirrors on opposite sides of the active layer in accordance with this invention. The nitride based resonant cavity semiconductor structure can be vertical cavity surface emitting laser (VCSEL), a light emitting diode (LED), or a photodetector (PD), or a combination of these devices. Gallium nitride semiconductor layers are grown on a sapphire substrate by techniques such as organometallic vapor phase epitaxy ("OMVPE") or hydride vapor phase epitaxy ("HVPE") as is well-known in the art.

Figure 1:
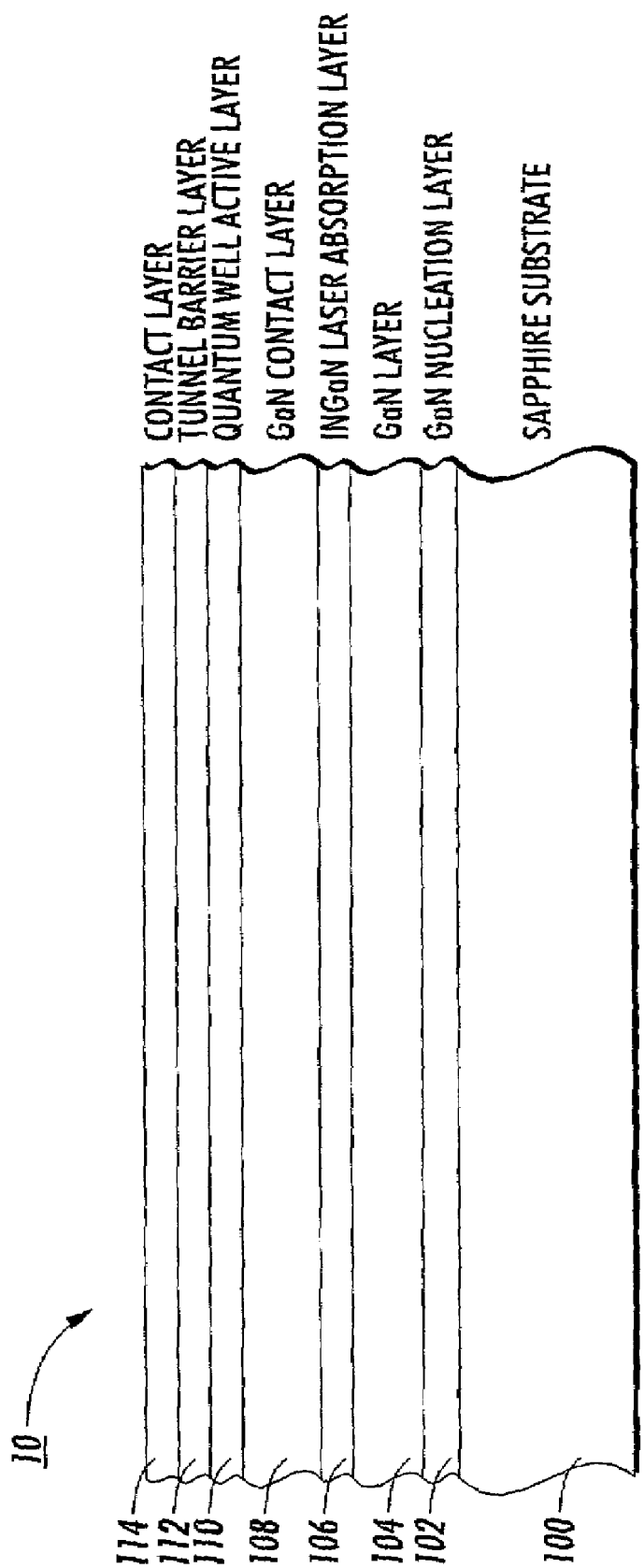
FIG. 1 is a side view of a nitride based resonant cavity structure, grown by epitaxial deposition, prior to device processing.

In FIG. 1, OMVPE growth of the nitride based resonant cavity semiconductor structure 10 is typically performed on a sapphire substrate 100. The substrate 100 can be a C-face (0001) or A-face (1120) oriented sapphire ($Al_2O_3$) substrate. The sapphire substrate 100 is of standard specifications including an epitaxial polish on one or both sides and a typical thickness ranging on the order of 200 $\mu$m to 1000 $\mu$m.

A gallium nitride nucleation layer 102 is first grown on the sapphire substrate 100. A gallium nitride layer 104 is then grown on the nucleation layer 102.

The substrate temperatures during growth are typically 550 degrees C. for the approximately 200 Angstrom thin GaN nucleation layer 102 and 1000 degrees C. to 1200 degrees C. for the GaN layer 104. The deposition rates are typically in the order of 1 $\mu$m/hour to 20 $\mu$m/hour. The thick GaN layer 104 has typically a depth ranging between 60 $\mu$m to 300 $\mu$m. In addition, the reactor pressure may be controlled between 50 Torr and 1500 Torr. As organometallic precursors, TMGa (trimethylgallium) or TEGa (triethylgallium) can be used for the group III elements and $NH_3$ (ammonia) can be used as the nitrogen source. Hydrogen and/or nitrogen are used as carrier gas for the metalorganic sources.

Another deposition technique for the growth of a thick GaN layer well known in the art is HVPE. HVPE growth is also typically performed on a sapphire substrate. The substrate 100 can be a C-face (0001) or A-face (1120) oriented sapphire ($Al_2O_3$) substrate. However, other substrate orientations may also be used. The substrate temperatures during growth are typically 500 to 600 degrees C. for the thin GaN nucleation layer 102 and 1000 degrees C. to 1200 degrees C. for the thick GaN layer 104. The deposition rates are typically in the order of 10 $\mu$m/hour up to several 100 $\mu$m/hour. GaCl is used as group III element source, which is produced by flowing HCl gas over liquid gallium. $NH_3$ (ammonia) is used as the nitrogen source. Hydrogen and/or nitrogen are used as carrier gases.

In principle, other deposition methods like molecular beam epitaxy ("MBE") could be used, although the relatively small deposition rates of MBE would make it difficult to grow thick GaN layers. One can also use a combination of the above mentioned deposition techniques. For example OMVPE could be used to grow a high quality GaN nucleation layer 102 with a depth of approximately 1–2 $\mu$m and HVPE can be used subsequently to grow the very thick GaN layer 104 on top of the nucleation layer 102.

A laser absorption InGaN layer 106 is then grown on the GaN buffer layer 104. The sacrificial layer 106 typically has a thickness of between 1500 angstroms and 4000 angstroms.

A III–V nitride contact layer 108 is formed on the laser absorption layer 106. The III–V nitride layer 108 is an n-type GaN:Si layer acting as a lateral n-contact and current spreading layer. The contact and current spreading layer 108 typically has a thickness of from about 1 $\mu$m to about 20 $\mu$m. In this embodiment, the contact layer 108 is also a cladding layer that functions to confine carriers to the active region 110. Other embodiments may employ additional cladding layers consisting of AlGaN:Si.

On top of the III–V nitride cladding layer 108, a III–V nitride quantum well active region 110 is formed. The quantum well active region 110 is comprised of at least one InGaN quantum well. For multiple-quantum well active regions, the individual quantum wells typically have a thickness of from about 10 Å to about 100 Å and are separated by InGaN or GaN barrier layers which typically have a thickness of from about 10 Å to about 200 Å.

A III–V nitride tunnel barrier layer 112 is formed over the quantum well active region 110. The tunnel barrier layer is typically AlGaN with Al content greater than 5% and thickness of 5 to 100 nm. The tunnel barrier layer provides a barrier for blocking mobile electrons and confining them to the active region 110.

A III–V nitride contact layer 114 is formed over the tunnel barrier layer 112. The p-type GaN:Mg layer 114 forms a p-contact layer for the minimum-resistance metal electrode to contact the p-side of the laser heterostructure. It also functions as a cladding layer to confine carriers to the active region 110. Other embodiments may employ additional AlGaN cladding layers (not shown in the Figure) or use AlGaN layers for cladding layer 108 or contact layer 114 or both. The AlGaN layer used for cladding layer 114 may have the same composition as the tunnel barrier layer 112. The III–V nitride contact layer 114 typically has a thickness of from about 10 nm to 200 nm.

Figure 2:
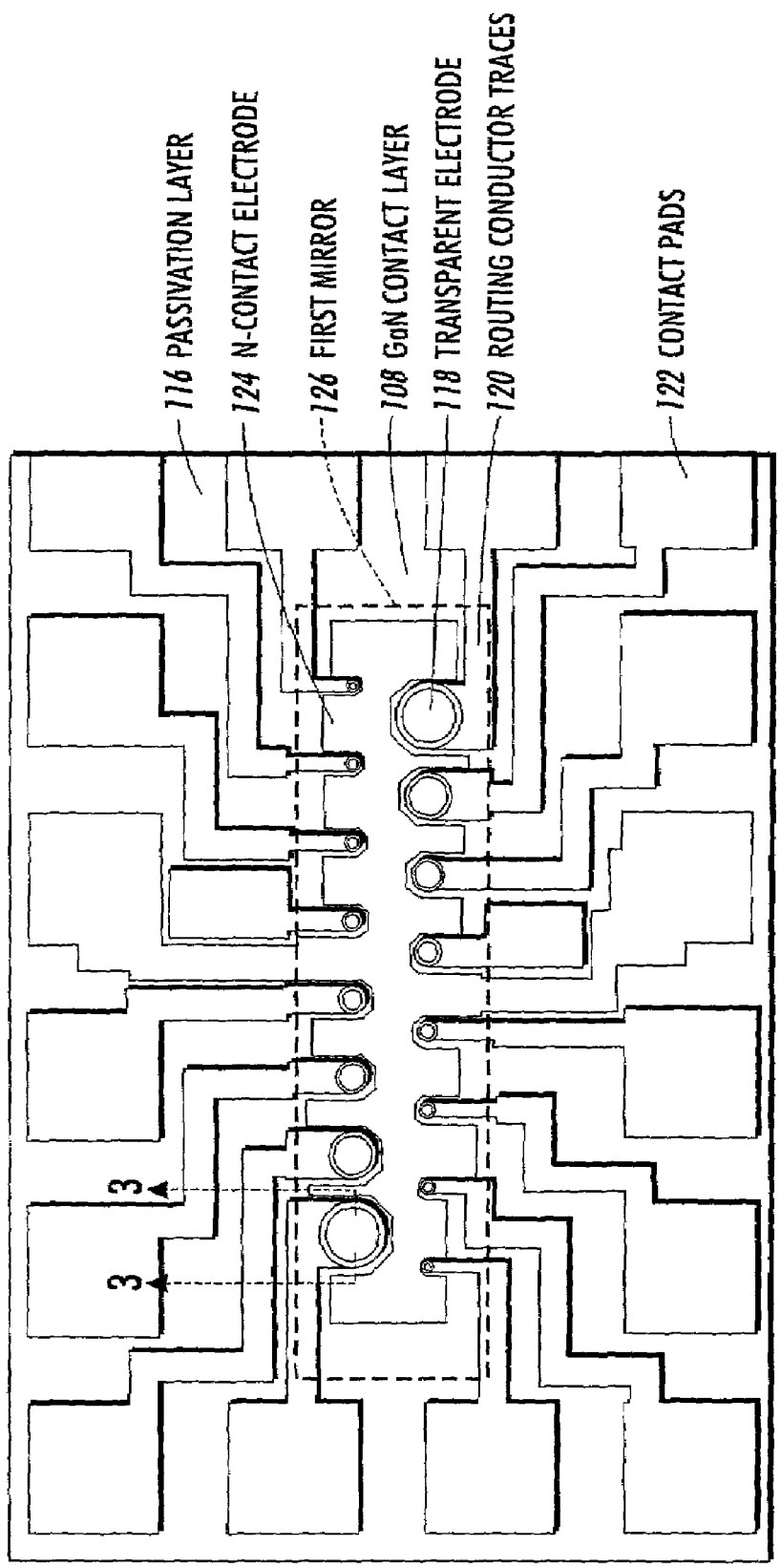
FIG. 2 is a top view of the nitride based resonant cavity structure of FIG. 1 with a first mirror formed in accordance with a first embodiment of the present invention.

FIG. 2 is a top view of an array of devices after partial processing of the epitaxial layers. The passivation layer 116 is first deposited on top of the contact layer 114. Layer 116 is typically an insulating thin film such as silicon dioxide or silicon nitride deposited by plasma enhanced chemical vapor epitaxy (PECVD). Film 116 is patterned by conventional photolithography and etching techniques to form openings into which electode 118 is formed. Electrode 118 forms an electrical contact with contact layer 114 and is typically a transparent conductive material such as Indium Tin Oxide (ITO) or Zinc oxide. Electrode 118 allows uniform current injection in cases where layer 114 is highly resistive. It is not necessary if layer 114 can be made sufficiently conductive.

The transparent electrode 118 should be well designed to ensure adequate current spreading while minimizing light absorption through this layer. A post-deposition thermal anneal may also be performed to improve the light transmission properties of layer 118 and to produce good electrical contact between layers 118 and 114. In the case of ITO, an anneal temperature of between 300° C. and 900° C. can be used. This anneal step can be used to simultaneously activate the p-dopants in layer 114.

In some designs, the transparent electrode 118 can have an optical thickness of approximately half wavelength or an integral number of half wavelengths. This phase matching minimizes its effect on the overall reflectivity of subsequently deposited mirrors. In another design, the transparent electrode 118 can be made very thin to minimize absorption. A thickness of 10 nm to 20 nm is found to have sufficient film conductivity to ensure adequate current spreading. Thinner film may be possible by optimizing the stoichiometry of the trasparent electrode.

The transparent electrode 118 can be replaced with a non-transparent electrode. In one embodiment, the non-transparent electrode may include a plurality of openings for light emission or absorption from the resonant cavity while providing current spreading evenly to ensure an adequate electrical contact for the resonant cavity structure. The mesh electrode can be Ti/Al.

Highly conductive routing traces and contact pads 120 are then deposited. The conductive traces connect the transparent electrode 118 to easily accessible contact pads 122. Traces 120 and pads 122 can be a 50 nm Ti/300 nm Au bilayer or any other highly conductive material. Contact layer 108 is then exposed by etching such as chemically-assisted ion beam etching (CAIBE). An n-contact electrode 124 is formed to establish electrical contact with 108. Contact electrode 124 can be Ti/Al.

A first highly reflective mirror 126 is formed over the p-contact layer 114. The first highly reflective mirror 126 is typically a distributed Bragg reflector. An embodiment utilizing distributed Bragg reflectors has ten pairs of quarter-wavelength thick alternating silicon dioxide ($SiO_2$) and tantalum pentoxide ($Ta_2O_5$) dielectric layers. Alternately, the DBR can have alternating layers of $SiO_2/TiO_2$, or $ZrO_2/SiO_2$ (zirconium dioxide/silicon dioxide), $HfO_2$ (halfnium dioxide) and tantalum pentoxide ($Ta_2O_5$), or GaN/AlGaN or alternating layers of AlGaN with different aluminum content. Also, the DBR can have more or less than six pairs of alternating layers. More pairs can be used if higher reflectivity is desired. However, fewer number of pairs may be used in the case of LEDs or photodetectors in order to increase light transmission.

The first highly reflective mirror 126 can also be a metal terminated layer stack of dielectric materials. A pair of quarter-wavelength thick alternating silicon dioxide ($SiO_2$) and tantalum pentoxide ($Ta_2O_5$) dielectric layers are deposited on a metallic layer of aluminum to form the first highly reflective mirror. Other dielectric material layers and other metallic layers may be used to form the first mirror.

Figure 3:
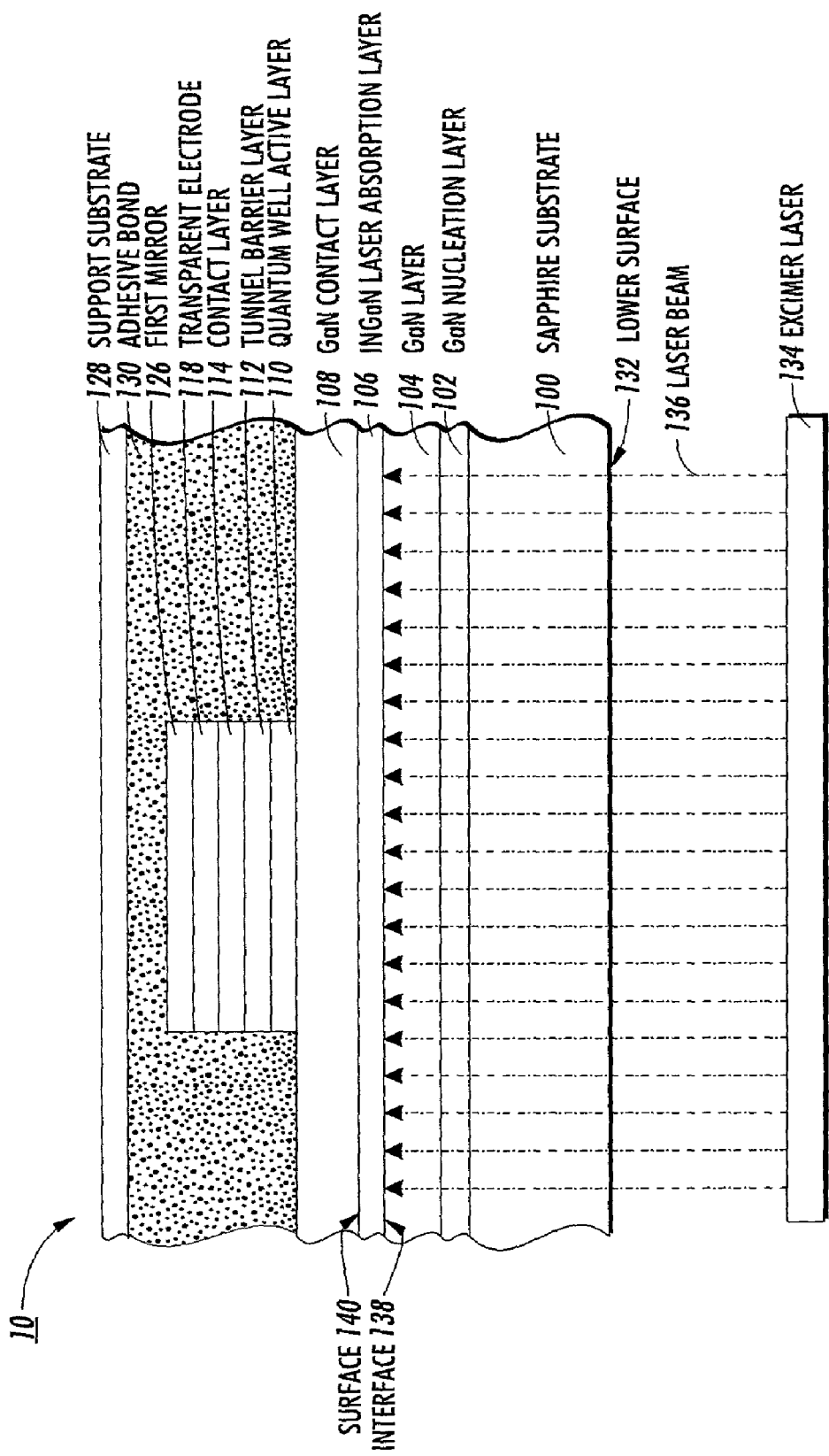
FIG. 3 is a side view of the laser lift-off process along section A—A of FIG. 2 for removing the sapphire substrate from the nitride based resonant cavity structure.

FIG. 3 shows a side view of the laser lift-off process along section 3—3 of FIG. 2. The first mirror 126 and the exposed contact layer 108 of the structure 10 is bonded to a support substrate 128 using an adhesive bond 130. The adhesive 130 may be a cyanoacrylate-based glue. The support substrate can be silicon (Si), gallium arsenide (GaAs), copper (Cu) or any rigid material. The adhesive could alternately be a thin film adhesive, spin-on glass, or any appropriate solder.

The lower surface 132 of the sapphire substrate 100 is polished to a very smooth surface finish to minimize light scattering. Polishing is accomplished mechanically using a succession of diamond pads (not shown). During the polishing procedure, the diamond grit size is gradually reduced from a grit size of about 30 $\mu$m down to a grit size of 0.1 $\mu$m. Typical root mean square (rms) roughness after polishing is about 20–50 Angstrom. Polishing may be done before bonding to the support substrate.

As shown in FIG. 3, an ultraviolet excimer laser 134 then emits a laser beam 136 which is transmitted through the sapphire substrate 100 to the interface 138 between the GaN buffer layer 104 and the laser absorption InGaN layer 106. Sapphire and gallium nitride are transparent to the wavelength of the light beam emitted by the laser. Proper adjustment of the excimer laser allows decomposition of the thin laser absorption InGaN layer 106 at the interface 138 between the GaN buffer layer 104 and the sacrificial InGaN layer 106.

The InGaN layer 106 is decomposed into indium and gallium metal and gaseous nitrogen by the radiation from the laser beam through the sapphire substrate and the gallium nitride layer. The InGaN layer 106 is a laser absorption layer with the wavelength of the light beam 136 matching the decomposition of the indium.

A homogenizer (not shown) converts the Gaussian-profile beam emitted by the laser to a flat plateau-like laser beam which provides improved beam uniformity.

A larger surface area of the laser absorption InGaN layer may be exposed by scanning the laser beam across the interface surface rather than providing a stationary beam. The excimer laser is typically pulsed in the range of 5–10 Hz with one pulse typically being sufficient to achieve decomposition of the GaN layer. The polished lower surface 132 of the sapphire substrate 100 allows uniform excimer laser exposure of the InGaN layer 106.

After separation of the sapphire substrate 100 and the gallium nitride layers 102 and 104 from the nitride based resonant cavity semiconductor structure 10, any residual indium or gallium metal on the surface 140 of the GaN contact layer 108 is removed with a hydrochloric acid (HCL) and water solution dip (HCL:$H_2O$=1:1).

The sapphire substrate 100 is reusable for subsequent fabrication of nitride based semiconductor structures. The substrate 100 need not be sapphire but can be any optically transparent material which is transmissive to the wavelength of the light beam 136 from the laser 134 and suitable for growth of GaN layers on its surface.

Figure 4:
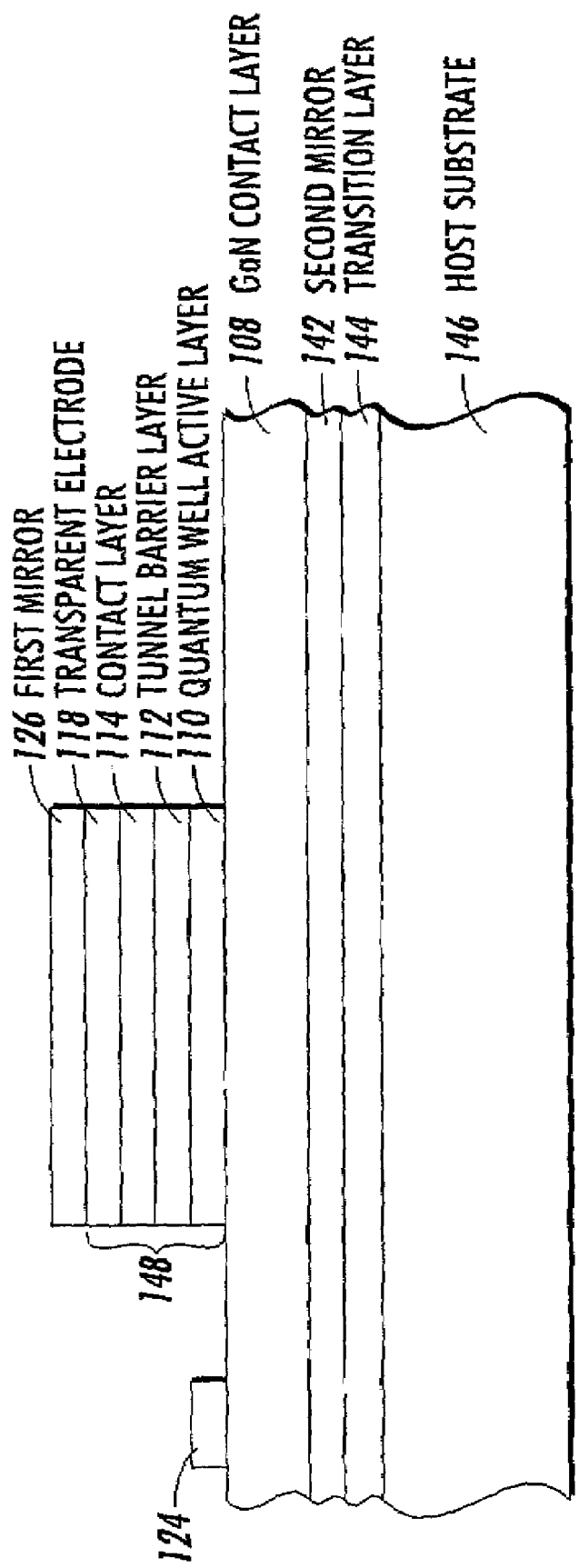
FIG. 4 is a side view of a nitride based resonant cavity structure in accordance with a first embodiment of the present invention.

As shown in FIG. 4, layer 108 is then trimmed to an appropriate thickness of 300 nm by CAIBE or other means. Accurate control of the etch-back can be achieved by monitoring the appearances of previously etched vias. These vias are formed by etching layers 114, 112, 110, and part of 108 to an appropriate depth prior to laser lift-off.

A second highly reflective mirror 142 is deposited on layer 108. The second highly reflective irror 142 is typically a distributed Bragg reflector. An embodiment utilizing distributed Bragg reflectors has twelve pairs of quarter-wavelength thick alternating silicon dioxide ($SiO_2$) and tantalum pentoxide ($Ta_2O_5$) dielectric layers. Alternately, the DBR can have alternating layers of $SiO_2$/$TiO_2$, or $ZrO_2$/$SiO_2$, $HfO_2$ and tantalum pentoxide ($Ta_2O_5$), or GaN/AlGaN or alternating layers of AlGaN with different aluminum content. Also, the DBR can have more or less than ten pairs of alternating layers.

The second highly reflective mirror 142 can also be a metal terminated layer stack of dielectric materials. A pair of quarter-wavelength thick alternating silicon dioxide ($SiO_2$) and tantalum pentoxide ($Ta_2O_5$) dielectric layers are deposited on a metallic layer of aluminum to form the second highly reflective mirror. Other dielectric material layers and other metallic layers may be used to form the second mirror.

A transition layer 144 may be deposited on mirror 142 to facilitate formation of host substrate 146. In an embodiment, the transition layer can be 50 nm Ti/200 nm Au. The host substrate 146 can be a 150 $\mu$m-thick copper electroplated onto layer 144. Alternatively, the transition layer 144 can be an adhesive or solder bonding any rigid host substrate 146 to layer 142. Temporary support 128 and adhesive 130 are then removed.

Mirrors 146 and 142 sandwich a resonant optical cavity 148 formed by layers 108, 110, 112 and 114. The optical thickness of the optical cavity 148 is typically designed so that it is approximately an integral number of the resonant wavelength. Furthermore, it is desirable to design the optical cavity so that the resonant standing wave peaks at the active region 110 to enhance the interaction between light and the gain region. In an embodiment, layers 108 and 114 have thicknesses of approximately 296 and 276 nm, respectively. Tunnel barrier layer 114 is AlGaN containing approximately 20% aluminum and has a thickness of approximately 20 nm.

The nitride-based layers 108, 110, 112, and 114 of the resonant cavity structure 10 are typically grown epitaxially, while the electrode 118 and first mirror 126 are deposited during device fabrication after epitaxial growth. The backside second mirror 142 is deposited after separating the processed epi-grown layers from their original substrate through laser-assisted epitaxial lift-off techniques. A suitable transition layer 144 such as gold or nickel can be deposited to facilitate attachment of the host substrate 146, but may not be necessary. The host substrate 146 is preferably a material with high thermal conductivity such as diamond-coated silicon or copper.

Figure 5:
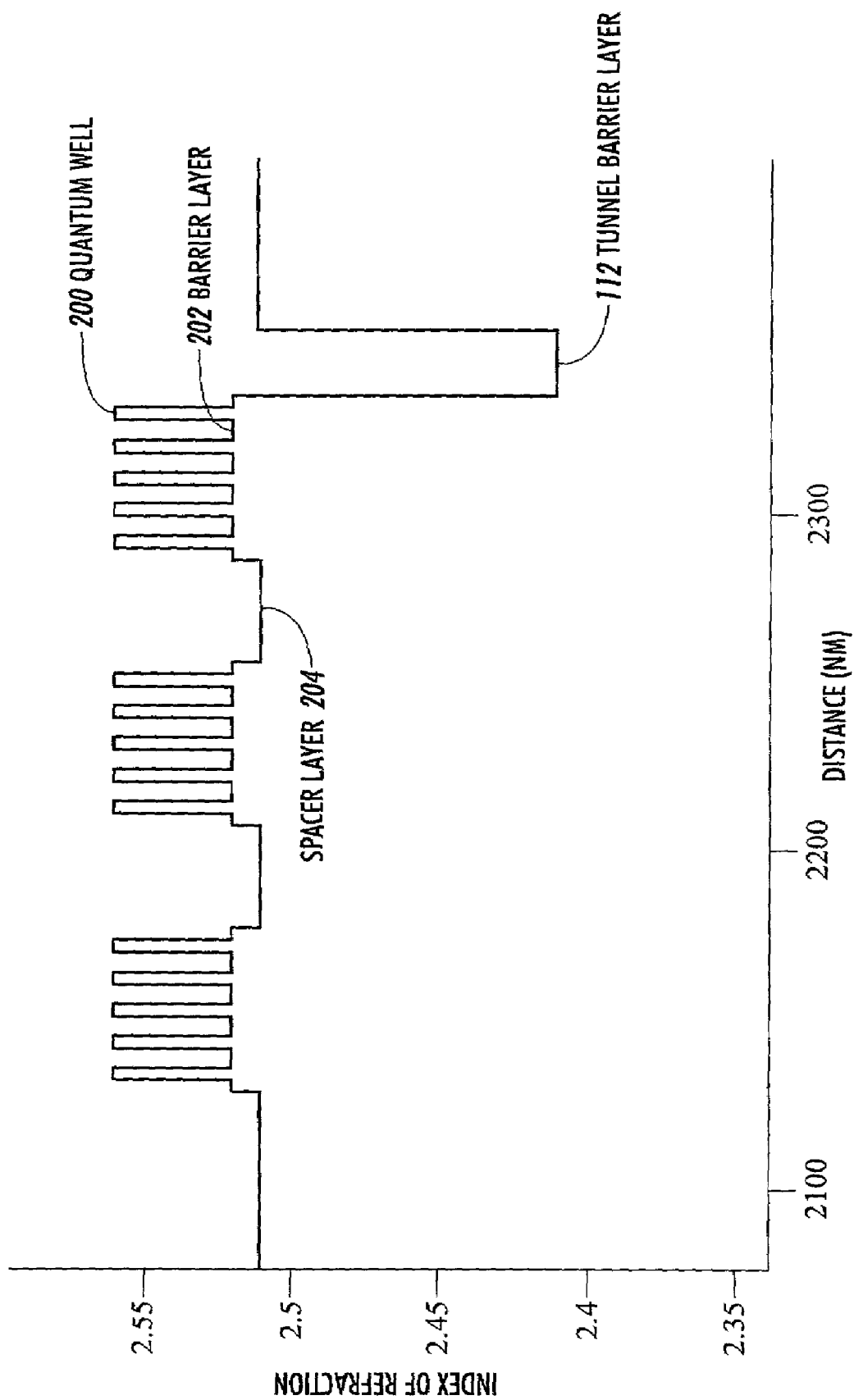
FIG. 5 is a plot detailing the active region of the nitride based resonant cavity structure in accordance with a first embodiment of the present invention

FIG. 5 is a plot representing an embodiment of the active region 110. The active region consists of three groups of multiple quantum wells. Each group has 5 quantum wells. The quantum wells 200 are InGaN with 7–8% In content and have thicknesses of about 3.5 nm. The barrier layers 202 are InGaN with 1–2% In content and have thicknesses of about 6 nm. The spacer layers 204 separating each group of MQW are GaN with thicknesses of about 31 nm. In this design, the resonant optical electric field peaks at each of the three MQW region. An optical field null also occurs at the transparent electrode layer 118 to minimize light absorption at that layer.

Figure 6:
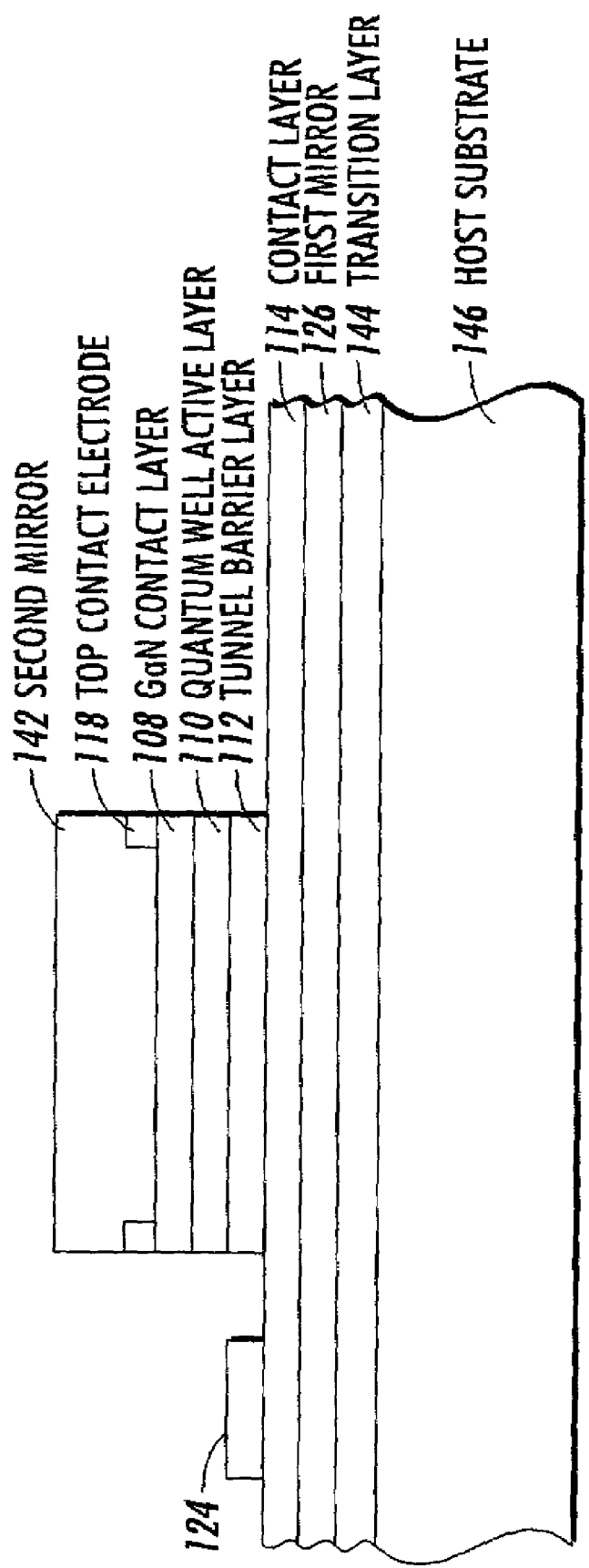
FIG. 6 is a side view of the inverted nitride based resonant cavity structure in accordance with a second embodiment of the present invention.

FIG. 6 is an alternative embodiment featuring an inverted structure. In this embodiment, the first mirror 126 is deposited and attached to a host substrate 146 after epitaxial growth but before device processing. The saphire substrate 100 is removed as already described. Epi layers 108, 110, and 112 are then etched using chemically-assited ion beam etching (CAIBE) or reactive ion beam etching (RIE) in an Ar/Cl2/BCL3 gas mixture exposing contact layer 114. P-electrode 118 and n-electrode 124 are formed and the second mirror 142 deposited. A transparent electrode is not used over layer 108 in this embodiment because layer 108 is typically n-doped and sufficiently conductive to uniformly spread the injected current. Instead, an annular n-electrode 124 is used. A transparent p-electrode 118 may be used at the interface of contact layer 114 and first mirror 126 to improve the current spreading capability of layer 114.

The nitride based resonant cavity semiconductor structure 10 can be either a vertical cavity surface emitting laser (VCSEL), a light emitting diode (LED, or a photodetector (PD), or a combination of these devices.

If the semiconductor structure 10 is a VCSEL, then the first mirror 126 and the second mirror 142 are highly reflective by increasing the number of high refractive index/low refractive index semiconductor or dielectric layer pairs and/or increasing the difference between the high refractive index and low refractive index. A forward biased electrical potential is applied between the p-electrode 118 and the n-electrode 124 causing emission of light from the active region 110 which is amplified in the resonant cavity 148 by continuous reflection between the two DBRs 126 and 142 and before emission of coherent light through the first DBR 126 of the VCSEL structure 10.

If the semiconductor structure 10 is a LED, then the light transmission mirror 126 in FIG. 4 and mirror 142 in FIG. 6 is less reflective than those of a VCSEL by decreasing number of high refractive index/low refractive index dielectric or semiconductor layer pairs and/or decreasing the difference between the high refractive index and low refractive index. A forward biased electrical potential is applied between the p-electrode and the n-electrode causing emission of light from the active region 110 in the resonant cavity 148 through the light transmission mirror of the LED structure.

If the semiconductor structure 10 is a photodetector, then the light transmission mirror 126 in FIG. 4 and mirror 142 in FIG. 6 is less reflective than those of a VCSEL by decreasing number of high refractive index/low refractive index dielectric or semiconductor layer pairs and/or decreasing the difference between the high refractive index and low refractive index.

A reverse biased electrical potential is applied between the p-electrode 118 and the n-electrode 124 causing absorption of light in the active region 114 in the resonant cavity t of the LED structure 10. The absorption will produce a photocurrent.

The nitride based resonant cavity semiconductor structure can emit light from the VCSEL or LED or absorb light from the photodetector if the substrate is transparent to the wavelength of light emitted or absorbed.

The use of laser-assisted epitaxial lift-off of the first sapphire substrate allows access to the backside of nitride based semiconductor layers for the fabrication of distributed Bragg reflectors on both sides of the nitride based resonant cavity semiconductor structure.

An integrated nitride based resonant cavity semiconductor structures can be fabricated with a VCSEL and a photodetector, or a LED and a photodetector, or a VCSEL and a LED, or with a VCSEL, LED and a photodetector.

While the invention has been described in conjunction with specific embodiments, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

What is claimed is:

1. A nitride based resonant cavity semiconductor structure comprising:
   a substrate;
   a lower mirror including a first side and a second side, the first side of the lower mirror coupled to the substrate;
   a plurality of III–V nitride semiconductor layers, coupled to the second side of the lower mirror by a noncrystalline interface material, said plurality of III–V nitride semiconductor layers forming a resonant cavity, at least one of said plurality of III–V nitride semiconductor layers forming an active region;
      an upper mirror on said plurality of III–V nitride semiconductor layers, opposite said lower mirror; and
      electrodes on two of said plurality of III–V nitride semiconductor layers to bias said active region.

2. The nitride based resonant cavity semiconductor structure of claim 1 wherein said nitride based resonant cavity semiconductor structure is a vertical cavity surface emitting laser.

3. The nitride based resonant cavity semiconductor structure of claim 2 wherein a sufficient forward bias is applied to said active region to cause lasing from said resonant cavity through a surface of said semiconductor structure.

4. The nitride based resonant cavity semiconductor structure of claim 1 wherein said nitride based resonant cavity semiconductor structure is a light emitting diode.

5. The nitride based resonant cavity semiconductor structure of claim 4 wherein a sufficient forward bias is applied to said active region to cause light emission from said resonant cavity through a surface of said semiconductor structure.

6. The nitride based resonant cavity semiconductor structure of claim 1 wherein said nitride based resonant cavity semiconductor structure is a photodetector.

7. The nitride based resonant cavity semiconductor structure of claim 6 wherein a sufficient reverse bias is applied to said active region to cause light absorption from said resonant cavity.

8. The nitride based resonant cavity semiconductor structure of claim 1 wherein a plurality of resonant cavities are formed, said plurality of resonant cavities being at least two of said group of vertical cavity surface emitting laser, light emitting diode and photodetector.

9. The nitride based resonant cavity semiconductor structure of claim 1 wherein at least one of said electrodes is a transparent electrode between said plurality of III–V nitride semiconductor layers and said upper mirror.

10. The nitride based resonant cavity semiconductor structure of claim 9 wherein said transparent electrode is an indium tin oxide layer.

11. The nitride based resonant cavity semiconductor structure of claim 9 wherein said transparent electrode is a zinc oxide layer.

12. The nitride based resonant cavity semiconductor structure of claim 1 further comprising a mesh electrode between said plurality of III–V nitride semiconductor layers and said upper mirror.

13. The nitride based resonant cavity semiconductor structure of claim 1 wherein said lower mirror is a distributed Bragg reflector and said upper mirror is a distributed Bragg reflector.

14. The nitride based resonant cavity semiconductor structure of claim 1 wherein said lower mirror is a dielectric material layer on a metallic layer and said upper mirror is a dielectric material layer on a metallic layer.

15. The nitride based resonant cavity semiconductor structure of claim 1 wherein said lower mirror is a distributed Bragg reflector and said upper mirror is a dielectric material layer on a metallic layer.

16. The nitride based resonant cavity semiconductor structure of claim 1 wherein said lower mirror is a dielectric material layer on a metallic layer and said upper mirror is a distributed Bragg reflector.

17. The nitride based resonant cavity semiconductor structure of claim 1 wherein said active region further comprises three groups of quantum wells, each group having five quantum wells.

18. The nitride based resonant cavity semiconductor structure of claim 1 wherein at least one of the two electrodes is a transparent electrode between said plurality of III–V nitride semiconductor layers and said upper mirror, wherein the optical field of said light emitted from said active region is at a null at said transparent electrode.

19. The nitride based resonant cavity semiconductor structure of claim 1 wherein at least one of the two electrodes is a transparent electrode between said plurality of III–V nitride semiconductor layers and said upper mirror, wherein the thickness of said transparent electrode is an integral number of the resonant half-wavelength of light emitted from said active region.

20. The nitride based resonant cavity semiconductor structure of claim 1 wherein the substrate is a metallic host substrate on said lower mirror, opposite said plurality of III–V nitride semiconductor layers.

21. The nitride based resonant cavity semiconductor structure of claim 1 wherein the entire lower mirror is noncrystal line.

22. The nitride based resonant cavity semiconductor structure of claim 1 wherein the upper mirror is noncrystalline.

23. The nitride based resonant cavity semiconductor structure of claim 1 wherein the lower mirror is a dielectric.

24. The nitride based resonant cavity semiconductor structure of claim 1 wherein the lower mirror is deposited using an evaporation process.

25. The nitride based resonant cavity semiconductor structure of claim 1 wherein the lower mirror is deposited using a sputtering process.

26. The nitride based resonant cavity semiconductor structure of claim 1 wherein the substrate is a good thermoconductor.

27. The nitride based resonant cavity semiconductor structure of claim 26 wherein the substrate is a metal.

28. The nitride based resonant cavity semiconductor structure of claim 27 wherein the metal is electroplated copper.

29. The nitride based resonant cavity semiconductor structure of claim 26 wherein the lower mirror is bonded to the substrate.

30. The nitride based resonant cavity semiconductor structure of claim 1 wherein the lower mirror and the upper mirror are both dielectric mirrors.

31. A resonant cavity semiconductor structure comprising:
   a substrate;
   a lower mirror including a first side and a second side, the first side of the lower mirror being coupled to the substrate;
   a plurality of III–V semiconductor layers, coupled to the second side of the lower mirror by a noncrystalline interface material, said plurality of III–V semiconductor layers forming a resonant cavity, at least one of said plurality of III–V semiconductor layers forming an active region;
   an upper mirror on said plurality of III–V semiconductor layers, opposite said lower mirror; and
   electrodes on two of said plurality of III–V semiconductor layers to bias said active region.

32. A resonant cavity structure comprising:
   two or more epitaxial III–V semiconductor layers, the semiconductor layers having an earlier side and a later side opposite each other, the semiconductor layers having been deposited from the earlier side to the later side; the semiconductor layers including an active region between the earlier side and the later side; the earlier side having been prepared for deposition of material after completion of the later side;
   a first set of layers deposited on the later side of the semiconductor layers; the first set of layers including a first mirror;
   a second set of layers deposited on the earlier side of the semiconductor layers; the second set of layers including a second mirror; the structure including a resonant cavity between the first and second mirrors; and
   a host substrate;
   one of the first and second mirrors being a lower mirror and the other being an upper mirror; the set of layers that includes the lower mirror having first and second opposite sides; the host substrate being on the first side and the second side being attached to the semiconductor layers by non-crystalline interface material.

33. The resonant cavity structure of claim 32 in which the semiconductor layers include nitrides.

34. A method of producing a resonant cavity structure as in claim 32, the method comprising:
   epitaxially depositing the two or more semiconductor layers from the earlier side to the later side; and
   depositing the first set of layers on the later side; preparing the earlier side for deposition of material and depositing the second set of layers on the earlier side.

35. The method of claim 34 in which the act of epitaxially depositing is performed over a deposition substrate, the earlier side being disposed toward the deposition substrate and the later side being disposed away from the deposition substrate.

36. The method of claim 35 in which the act of epitaxially depositing comprises:
   depositing a sacrificial layer between the earlier side and the deposition substrate;
the act of depositing the first set of layers and preparing the earlier side and depositing the second set of layers comprising:
   depositing the first set of layers on the later side;
   attaching a temporary support over the first set of layers;
   decomposing the sacrificial layer to remove the deposition substrate and exposing the earlier side;
   preparing the earlier side for deposition of material; and
   depositing the second set of layers on the earlier side of the semiconductor layers;
the method further comprising:
   depositing or attaching the host substrate on the second set of layers and removing the temporary support.

37. The method of claim 35 in which the act of depositing the first set of layers and preparing the earlier side and depositing the second set of layers comprises:
   removing the semiconductor layers from the deposition substrate; and
   preparing the earlier side of the removed semiconductor layers for deposition of material.

38. The method of claim 37 in which the act of preparing the earlier side for deposition of material comprises:
   trimming a layer that includes GaN to a thickness of 300 nm.

39. The resonant cavity structure of claim 32 in which the non-crystalline interface material is an interface between epitaxial and non-epitaxial material.

* * * * *